United States Patent
Lee et al.

(10) Patent No.: US 6,849,529 B2
(45) Date of Patent: Feb. 1, 2005

(54) DEEP-TRENCH CAPACITOR WITH HEMISPHERICAL GRAIN SILICON SURFACE AND METHOD FOR MAKING THE SAME

(75) Inventors: Yueh-Chuan Lee, Hsinchu (TW); Shih-Lung Chen, Hsinchu (TW)

(73) Assignee: ProMOS Technologies Inc., Hsinchu (TW)

( * ) Notice: Subject to any disclaimer, the term of this patent is extended or adjusted under 35 U.S.C. 154(b) by 0 days.

(21) Appl. No.: 10/327,043

(22) Filed: Dec. 24, 2002

(65) Prior Publication Data

US 2004/0079979 A1 Apr. 29, 2004

Related U.S. Application Data

(60) Provisional application No. 60/421,070, filed on Oct. 25, 2002.

(51) Int. Cl.$^7$ .............................................. H01L 21/38
(52) U.S. Cl. ...................... 438/563; 438/558; 438/923; 257/E21.149

(58) Field of Search .................................. 438/558, 563, 438/923, 243, 246, 249, 386, 389, 255, 398, 964, FOR 220, FOR 488; 148/DIG. 138

(56) References Cited

U.S. PATENT DOCUMENTS

2003/0064591 A1 * 4/2003 Lutzen et al. ............... 438/689

* cited by examiner

Primary Examiner—George Fourson
Assistant Examiner—Thanh V Pham
(74) Attorney, Agent, or Firm—Finnegan, Henderson, Farabow, Garrett & Dunner, L.L.P.

(57) ABSTRACT

A method for manufacturing a trench capacitor that includes providing a semiconductor substrate, forming a deep trench in the substrate, forming a thin sacrificial layer on a surface of the trench, and forming a hemispherical silicon grain layer over the thin sacrificial layer, wherein the sacrificial layer has a thickness to act as an etch stop during a subsequent step to remove at least a portion of the hemispherical silicon grain layer, and is electrically conductive.

17 Claims, 4 Drawing Sheets

FIG. 1-A
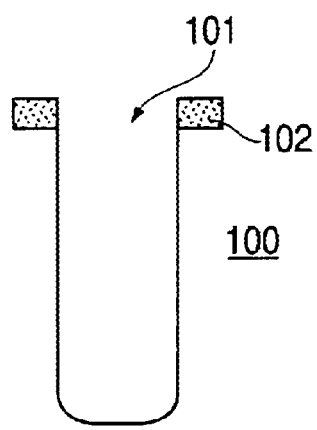
FIG. 1-B
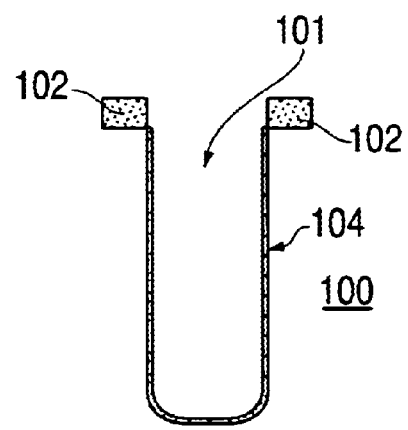
FIG. 1-C
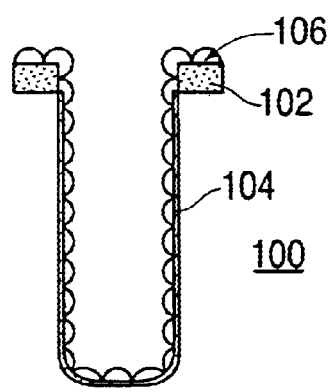
FIG. 1-D
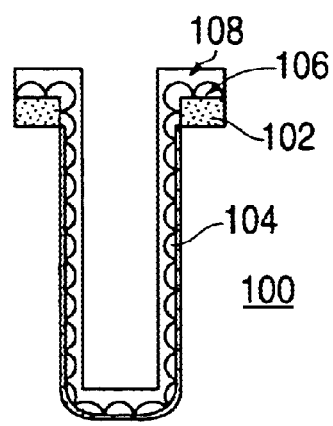
FIG. 1-E
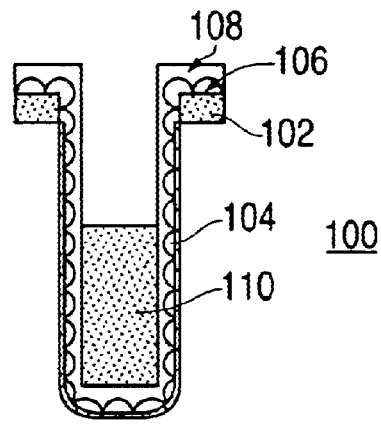

FIG. 1-F
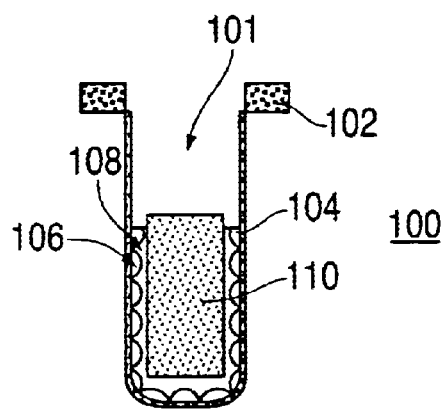
FIG. 1-G
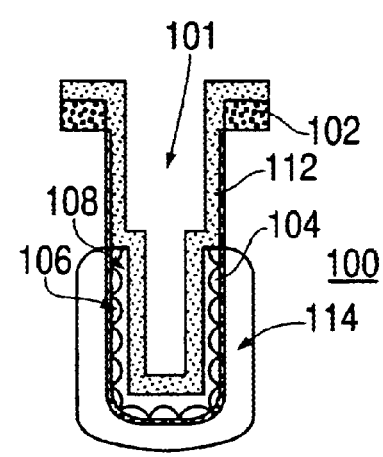
FIG. 1-H
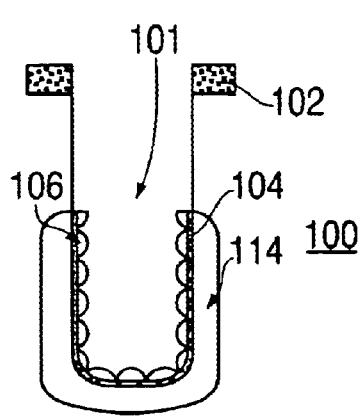
FIG. 1-I
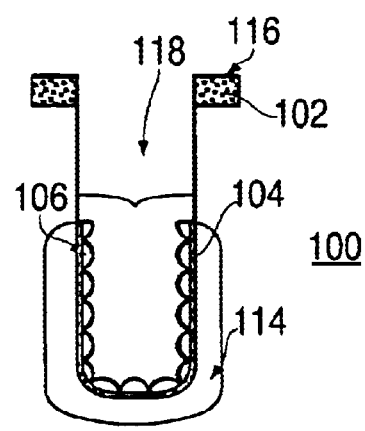
FIG. 1-J
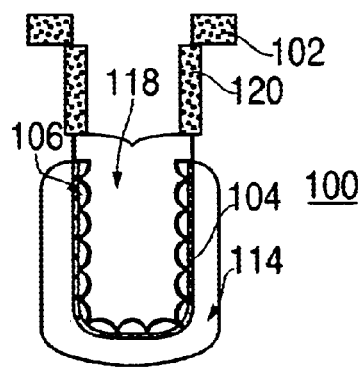

FIG. 2-A
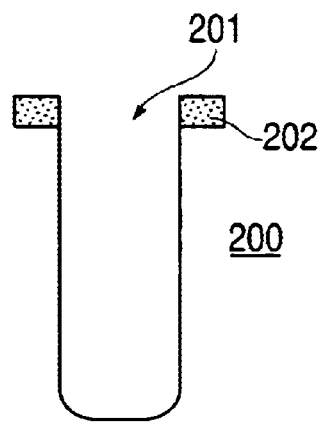
FIG. 2-B
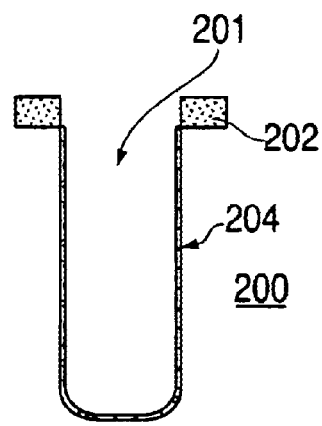
FIG. 2-C
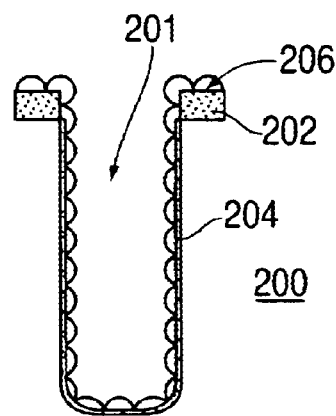
FIG. 2-D
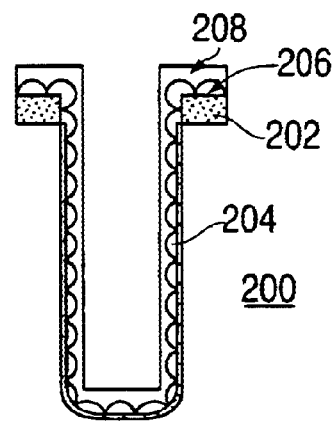
FIG. 2-E
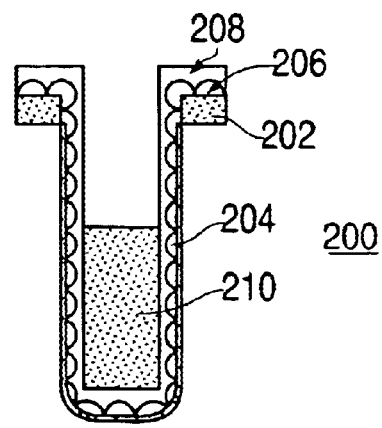

FIG. 2-F
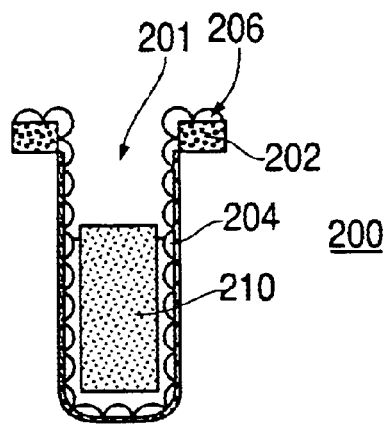
FIG. 2-G
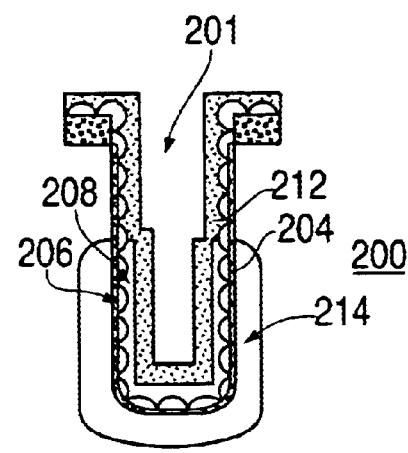
FIG. 2-H
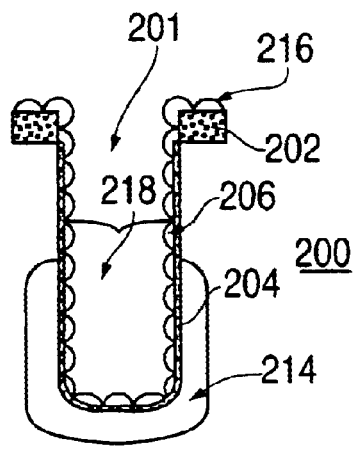
FIG. 2-I
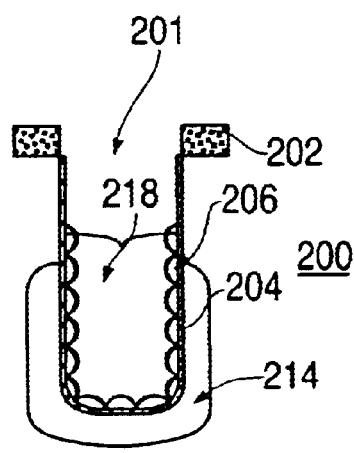
FIG. 2-J
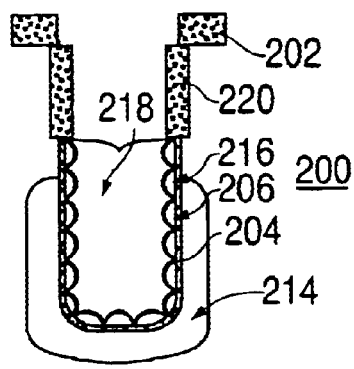

DEEP-TRENCH CAPACITOR WITH HEMISPHERICAL GRAIN SILICON SURFACE AND METHOD FOR MAKING THE SAME

The present invention claims the benefit under 35 U.S.C. §119(e) of provisional application Ser. No. 60/421,070, filed Oct. 25, 2002. This invention pertains in general to a semiconductor device, and, more particularly, to a trench capacitor with hemispherical grain silicon surface and method for making the same.

BACKGROUND OF THE INVENTION

Field of the Invention

In the semiconductor industry, memory cells are among the most important integrated circuit devices and have been the source of continuing research. Continued developments have been undertaken in the industry to increase storage capacity, enhance charge-retaining capability, improve writing and reading speeds, and decrease device dimensions of memory cells. Many memory cells rely on capacitors as charge storage devices. For example, a dynamic random access memory (DRAM) cell generally includes a transistor and a capacitor controlled by the transistor. The capacitor is a single charge storage capacitor for storing a logical status. The transistor, which is commonly referred to as a pass transistor, controls the writing and reading of the logical status stored in the capacitor. The transistor may be a field-effect transistor (FET), and frequently, an N-channel field effect transistor (N-FET). To further illustrate the background of the related art without limiting the scope and application of the present invention, the following paragraphs describe the application of a capacitor in a DRAM.

Generally, a DRAM cell can be divided into three designs: planar, stacked-capacitor, and trench. In the planar design, the transistor and capacitor of a cell are produced as planar components. The planar design generally requires more area per memory cell than the other two designs because the capacitor and transistor occupy separate areas of a semiconductor substrate. In the stacked-capacitor design, the capacitor of a cell is disposed above the transistor to reduce the substrate area occupied by each cell. Various designs for vertically extending the capacitor have been developed in recent years. In the trench design, the transistor is disposed on the surface of a substrate, and the capacitor is disposed in a trench formed in the substrate. The trench design allows the formation of densely arranged memory cell arrays.

Generally, trench capacitors provide comparatively large capacitance while occupying a comparatively small area on a semiconductor chip surface. Trench capacitors are characterized by deep and narrow trenches formed in the semiconductor substrate. An insulator or dielectric formed on the trench walls serves as the capacitor dielectric. Generally, two capacitor electrodes are formed with the capacitor dielectric being disposed between the two electrodes. The capacitance (C) of a trench capacitor is determined as follows:

$$C = \epsilon A/d,$$

where $\epsilon$ is the permittivity of a capacitor dielectric, A is the surface area of the capacitor dielectric, which is disposed between the two electrodes, and d is the thickness of the capacitor dielectric. From the foregoing relationship, the capacitance of a trench capacitor may be increased by providing a capacitor dielectric with a high permittivity ($\epsilon$), forming a trench capacitor having a large surface area of a capacitor dielectric (A), or using a thin capacitor dielectric.

Hemispherical silicon grain (HSG) has been used in stacked-capacitor DRAM cells to increase the surface area of the electrodes, which correspondingly increases the surface area of the dielectric. To integrate the HSG into trench capacitor DRAM cells, however, the HSG formed on the upper surfaces of the trenches must be removed for a number of reasons. The HSG formed on the upper surfaces of a trench further narrows an already narrow opening of the deep trench, which prevents electrode material, generally polysilicon, from fully filling the deep trench. The narrow trench opening therefore may create voids in the electrode to adversely affect the conductivity of the capacitor electrodes. In addition, an electrode having an overly narrow passage will likewise adversely affect the conductivity of the electrode. Furthermore, HSG may couple separate doped silicon substrate portions formed along one trench surface contiguous with an upper portion and lower portion of the deep trench to form an undesired parasitic transistor.

Removing HSG formed on the upper surfaces of the trench requires sacrificial layers, or sacrificial collars, to act as an etch stop to remove HSG without damaging the silicon substrate surface. However, conventional techniques of forming the sacrificial collars are complex and costly, one reason being the need to first provide the sacrificial layer, and then remove only the sacrificial layer formed on the mid- to lower-surfaces of the deep trench to maintain electrical connection between the doped silicon substrate portions contiguous with the lower surfaces of the deep trench and the subsequently-formed doped polysilicon provided in the deep trench.

SUMMARY OF THE INVENTION

In accordance with the invention, there is provided a method for manufacturing a trench capacitor that includes providing a semiconductor substrate, forming a deep trench in the substrate, forming a thin sacrificial layer on a surface of the trench, and forming a hemispherical silicon grain layer over the thin sacrificial layer, wherein the sacrificial layer has a thickness to act as an etch stop during a subsequent step to remove at least a portion of the hemispherical silicon grain layer, and is electrically conductive.

Also in accordance with the invention, there is provided a method for manufacturing a trench capacitor that includes providing a semiconductor substrate, forming a trench in the substrate, forming a thin sacrificial layer on a surface of the trench, forming a hemispherical silicon grain layer over the thin sacrificial layer, depositing a doped silicate glass layer on the hemispherical silicon grain layer, providing a photoresist inside the trench, removing exposed portions of the doped silicate glass layer; removing exposed portions of the hemispherical silicon grain layer, removing the photoresist provided in the trench, depositing a cap layer over the thin sacrificial layer and on a surface of the trench, annealing the doped silicate glass layer to form buried plates, removing at least the cap layer and exposed thin sacrificial layer, providing a layer of dielectric over the trench and hemispherical silicon grain surfaces, depositing polysilicon inside the trench, and etching the dielectric layer, wherein the sacrificial layer has a thickness to act as an etch stop during the step of removing exposed portions of the hemispherical silicon grain layer, and is electrically conductive.

In accordance with the present invention, there is additionally provided a method for manufacturing a trench capacitor that includes providing a semiconductor substrate, forming a trench in the substrate, forming a thin sacrificial layer on a surface of the trench, forming a hemispherical silicon grain layer over the thin sacrificial layer, depositing a doped silicate glass layer on the hemispherical silicon grain layer, providing a photoresist inside the trench, removing exposed portions of the doped silicate glass layer, removing the photoresist provided in the trench, depositing a cap layer over the thin sacrificial layer and on a surface of the trench, annealing the doped silicate glass layer to form buried plates, removing the cap layer, providing a layer of dielectric over the hemispherical silicon grain surfaces, depositing polysilicon inside the trench, and etching the dielectric layer, wherein the steps of removing the exposed doped silicate glass layer and of removing exposed hemispherical silicon grain layer comprise choosing a selectivity of an etch process such that the sacrificial layer acts as an etch stop to protect the trench surfaces.

Still in accordance with the present invention, there is provided a capacitor formed in a substrate of a semiconductor device that comprises a deep trench formed in the substrate having a surface, a sacrificial layer formed on the surface of the trench, wherein the sacrificial layer is electrically conductive, a hemispherical silicon grain layer formed on the sacrificial layer, and at least one buried plate formed in the substrate and contiguous with the sacrificial layer and separated from the hemispherical silicon grain layer.

Yet still in accordance with the present invention, there is provided a semiconductor device that comprises a substrate, a trench formed in the substrate having a first surface, a sacrificial layer formed on the first surface, wherein the sacrificial layer is electrically conductive, a hemispherical silicon grain layer formed on the sacrificial layer, and at least one buried plate formed in the substrate and on a surface opposing the first surface, wherein the at least one buried plate is separated from the hemispherical silicon grain layer.

Additional features and advantages of the invention will be set forth in the description which follows, and in part will be apparent from the description, or may be learned by practice of the invention. The features and other advantages of the invention will be realized and attained by the trench capacitor and method for manufacturing the trench capacitor particularly pointed out in the written description and claims thereof, as well as the appended drawings.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings,

FIGS. 1A–1J are cross-sectional views of a method for manufacturing a trench capacitor consistent with one embodiment of the present invention; and FIGS. 2A–2J are cross-sectional views of a method for manufacturing a trench capacitor consistent with another embodiment of the present invention.

DESCRIPTION OF THE EMBODIMENTS

Reference will now be made in detail to the embodiments of the invention, examples of which are illustrated in the accompanying drawings. Wherever possible, the same reference numbers will be used throughout the drawings to refer to the same or like parts.

The present invention provides a trench DRAM cell incorporating HSG on the surface of the trench capacitor and method for manufacturing the same. A thin sacrificial layer is provided on the trench surface prior to the formation of HSG. The sacrificial layer has a sufficient thickness to act as an etch stop during the subsequent removal of the HSG layers on the upper portions of the trench surface, and is thin enough to be electrically conductive. In one embodiment, the sacrificial layer comprises silicon nitride. It is known that when a silicon nitride layer is thin enough, it exhibits none of the dielectric characteristics related to electrical insulation. In one embodiment, the silicon nitride layer has a thickness of below approximately 18 Å. In another embodiment, the silicon nitride layer has a thickness of approximately 4~12 Å, preferably 8 Å. As a result, the silicon nitride layer provided on the mid- to lower surfaces of the deep trench need not be removed prior to the formation of the HSG layers, thereby simplifying the manufacturing process of a trench capacitor DRAM cell in accordance with the present invention, and, accordingly, decreasing the cost thereof.

FIGS. 1A–1J are cross-sectional views of a method for manufacturing a trench capacitor consistent with one embodiment of the present invention. Referring to FIG. 1A, the method of the present invention starts by defining a silicon substrate 100 and forming a trench 101 within substrate 100. As an example, photolithographic techniques are applied to define trench area 101, and an anisotropic etch, such as reactive ion etch (RIE) or high density plasma (HDP) etch, is employed to remove at least a portion of substrate 100 to form trench 101. A plurality of pad silicon nitride layers 102 may be formed around the opening of trench 101.

Referring to FIG. 1B, a thin sacrificial layer 104 is provided along trench 101 surface. Sacrificial layer 104 has a sufficient thickness to act as an etch stop during the subsequent removal of HSG layers formed on the upper portions of trench 101 surface, and is thin enough to be electrically conductive. In one embodiment, sacrificial layer 104 comprises silicon nitride ($SiN_x$) and may be formed through thermal nitridation in ambient ammonia ($NH_3$). It is known that when a silicon nitride layer is thin enough, it exhibits none of the dielectric characteristics related to electrical insulation. In one embodiment, silicon nitride layer 104 has a thickness of approximately 18 Å or less. In another embodiment, silicon nitride layer 104 has a thickness of approximately 4~12 Å, preferably 8 Å.

Referring to FIG. 1C, a thin HSG layer 106 is deposited along trench 101 surface. Referring to FIG. 1D, an As-doped silicate glass (ASG) layer 108 is deposited on HSG layer 106 through a conventional deposition process. Referring to FIG. 1E, a photoresist 110 is provided inside trench 101 and then etched back. The amount of photoresist 110 etched back depends on the requirements of a particular trench capacitor, for example, the desired capacitor depth, and one skilled in the art would know to adjust the etching recipe accordingly.

Referring to FIG. 1F, using photoresist 110 as a mask, the exposed portions of ASG layer 108 are removed through a wet etch. Again using photoresist 110 as a mask, exposed HSG layers 106 on the upper portions of trench 101 are removed. The selectivity of the etch process is chosen such that silicon nitride layer 104 acts as an etch stop to protect silicon substrate trench 101 surfaces. In one embodiment, the selective etching process is an $NH_4OH$-based wet etch. In another embodiment, an isotropic Si dry etch process is employed.

In an alternate embodiment, after ASG layer 108 formed on the upper portions of trench 101 is removed, photoresist material 110 provided in deep trench 101 is removed. Then, exposed HSG layer 106 on the upper portions of trench 101 is etched, using the remaining ASG layer 108 as a mask. Exposed portions of silicon nitride layer may also be removed after the step of stripping the HSG layer.

TABLE 1

| Dip time (min) | pre-dip thickness (Å) | post-dip thickness (Å) | etch rate (Å/min) |
| --- | --- | --- | --- |
| 5 | 1151 | 672 | 96 |
| 20 | 3013 | 1151 | 94 |
| 25 | 3029 | 795 | 89 |
| 30 | 3032 | 407 | 88 |

Table 1 shows that the silicon nitride layer of the present invention is able to provide the required selectivity to act as an etch stop during the HSG layer etch. The etch conditions for Table 1 are 60:1 $NH_4OH$ dip on poly-blanket wafers for 5, 20, 25, 30 minutes at 65° C., that respectively provide an etch rate of 96, 94, 89 and 88 angstroms per minute. Under the same conditions, the etch rate for the silicon nitride layer is approximately 2.1 angstroms per minute. Therefore, the silicon nitride sacrificial layer of the present invention having a thickness of approximately 8 Å is able to provide an etch selectivity of the HSG layer having a thickness of approximately 36 nm.

Referring to FIG. 1G, photoresist 110 provided in trench 101 is removed. After a conventional cap tetraethylorthosilicate (TEOS) 112 deposition, an ASG anneal process follows to diffuse the arsenic into silicon substrate 100 to form buried plates 114. Referring to FIG. 1H, TEOS layer 112, ASG layer 108 not diffused into silicon substrate 100, and exposed silicon nitride layers 104 are stripped. TEOS 112 and ASG 108 layers may be removed using a buffered oxide etch-based (BOE-based) wet etching, which is selective to HSG 106. The silicon nitride strip is preferably performed through a hydrogen fluoride (HF)/ethylene glycol (EG) wet etch.

Referring to FIG. 1I, a layer of dielectric 116 is provided over trench 101 and HSG surfaces 106. In one embodiment, dielectric layer 116 is an NO layer. The NO layer is formed by first depositing a layer of nitride, and then the nitride layer is oxidized to form a thin oxide layer. Conventional process steps then follow to deposite polysilicon 118 inside deep trench 101 to form a conductive electrode. A deposition process such as LPCVD, CVD, or pulse plasma CVD, using $SiH_4$ as the reactant gas and in-situ deposition to dope an n-type dopant, such as phosphorus, may be used to form the electrode. The deposition process may be followed by an etch-back process to remove excessive polysilicon 118.

Referring to FIG. 1J, using deposited polysilicon 118 as a mask, dielectric layer 116 is etched. Conventional processes follow to form oxide collars 120 on the upper portions of deep trench 101. One such process includes an anneal step to enhance the quality of oxide collars 120 prior to the etching process that forms collars 120.

FIGS. 2A–2J are cross-sectional views of a method for manufacturing a trench capacitor consistent with another embodiment of the present invention. FIGS. 2A–2E are identical to FIGS. 1A–1E, respectively. Referring to FIG. 2A, the method of the present invention starts by defining a silicon substrate 200 and forming a trench 201 within substrate 200. A plurality of pad silicon nitride layers 202 are formed around the opening of trench 201.

Referring to FIG. 2B, a thin sacrificial layer 204 is provided on trench 201 surfaces. Sacrificial layer 204 has a sufficient thickness to act as an etch stop during the subsequent removal of the HSG layers formed on the upper portions of trench 201 surfaces, and is thin enough to be electrically conductive. In one embodiment, sacrificial layer 204 comprises silicon nitride ($SiN_x$) and may be formed through thermal nitridation in ambient $NH_3$. It is known that when a silicon nitride layer is thin enough, it exhibits none of the dielectric characteristics related to electrical insulation. In one embodiment, silicon nitride layer 204 has a thickness of approximately 18 Å or less. In another embodiment, silicon nitride layer 204 has a thickness of approximately 4~12 Å, preferably 8 Å.

Referring to FIG. 2C, a thin HSG layer 206 is deposited on trench 201 surfaces. Referring to FIG. 2D, an ASG layer 208 is deposited on HSG layer 206 through a conventional deposition process. Referring to FIG. 2E, a photoresist 210 is provided inside trench 201 and then etched back. The amount of photoresist 210 etched back depends on the requirements of a particular trench capacitor.

Referring to FIG. 2F, using photoresist 210 as a mask, exposed portions of ASG layer 208 are removed through wet etch. Referring to FIG. 2G, photoresist material 210 provided in trench 201 is removed. After a conventional cap TEOS 212 deposition step, an ASG anneal process follows to diffuse the arsenic into silicon substrate 200 to form buried plates 214.

Referring to FIG. 2H, TEOS layer 212 is removed. A layer of dielectric 216 is then provided over HSG surfaces 206. In one embodiment, dielectric layer 216 is an NO layer. The NO layer is formed by first depositing a layer of nitride, and then the nitride layer is oxidized to form a thin oxide layer. Conventional process steps then follow to deposite polysilicon 218 inside the lower portion of deep trench 201 to form a conductive electrode. A deposition process such as LPCVD, CVD, or pulse plasma CVD, using $SiH_4$ as the reactant gas and in-situ deposition to dope an n-type dopant, such as phosphorus, may be used to form the electrode. The deposition process may be followed by an etch-back process to remove excessive polysilicon 218.

Referring to FIG. 2I, using deposited polysilicon 218 as a mask, exposed dielectric layer 216 is etched. Again using polysilicon 218 as a mask, exposed HSG layers 206 on the upper portions of trench 201 are removed. The selectivity of the etch process is chosen such that silicon nitride layer 204 acts as an etch stop to protect silicon substrate trench 201 surfaces. In one embodiment, the selective etching process is an $NH_4OH$-based wet etching. In another embodiment, a conventional isotropic silicon dry etch process is employed.

Referring to FIG. 2J, with polysilicon layer 218 acting as a mask, exposed silicon nitride layers 204 on the upper portions of trench 201 are removed. Conventional processes follow to form oxide collars 220 on the upper portions of deep trench 201. One such process includes an anneal step to enhance the quality of oxide collars 220 prior to the etching process that forms collars 220.

A trench capacitor formed with the method shown in FIGS. 2A–2J of the present invention, compared to a trench capacitor formed with the method shown in FIGS. 1A–1J, includes additional HSG layers directly below collars 220. Such additional HSG layers will increase the capacitance of the trench capacitor.

It will be apparent to those skilled in the art that various modifications and variations can be made in the disclosed device and method without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for manufacturing a trench capacitor, comprising:

providing a semiconductor substrate;

forming a trench in the substrate;

forming a thin sacrificial layer on a surface of the trench;

forming a hemispherical silicon grain layer over the thin sacrificial layer;

depositing a doped silicate glass layer on the hemispherical silicon grain layer, providing a photoresist inside the trench;

removing exposed portions of the doped silicate glass layer;

removing exposed portions of the hemispherical silicon grain layer;

removing the photoresist provided in the trench;

depositing a cap layer over the thin sacrificial layer and on a surface of the trench;

annealing the doped silicate glass layer to form buried plates;

removing at least the cap layer and the remaining doped silicate glass layer, and exposed thin sacrificial layer;

providing a layer of dielectric over the trench and hemispherical silicon grain surfaces;

depositing polysilicon inside the trench; and etching the dielectric layer, wherein the sacrificial layer has a thickness to act as an etch stop during the step of removing exposed portions of the hemispherical silicon grain layer, and is electrically conductive.

2. The method of claim 1, wherein the silicate glass layer is doped with arsenic.

3. The method of claim 1, further comprising etching back the photoresist.

4. The method of claim 1, further comprising forming oxide collars on the upper portions of the trench.

5. The method of claim 1, wherein the sacrificial layer comprises silicon nitride.

6. The method of claim 1, wherein the sacrificial layer is formed through thermal nitridation.

7. The method of claim 5, wherein the silicon nitride layer has a thickness of less than about 18 angstroms.

8. The method of claim 7, wherein the silicon nitride layer has a thickness of about 4 to 12 angstroms.

9. The method of claim 1, wherein the steps of removing the exposed doped silicate glass layer and of removing exposed hemispherical silicon grain layer comprise choosing a selectivity of an etch process such that the sacrificial layer acts as an etch stop to protect the trench surfaces.

10. The method of claim 1, wherein the dielectric layer comprises nitrogen oxide.

11. A method for manufacturing a trench capacitor, comprising:

providing a semiconductor substrate;

forming a trench in the substrate;

forming a thin sacrificial layer on a surface of the trench;

forming a hemispherical silicon grain layer over the thin sacrificial layer;

depositing a doped silicate glass layer on the hemispherical silicon grain layer;

providing a photoresist inside the trench;

removing exposed portions of the doped silicate glass layer;

removing the photoresist provided in the trench;

depositing a cap layer over the thin sacrificial layer and on a surface of the trench;

annealing the doped silicate glass layer to form buried plates;

removing the cap layer;

providing a layer of dielectric over the hemispherical silicon grain surfaces;

depositing polysilicon inside the trench; and etching the dielectric layer, wherein the steps of removing the exposed doped silicate glass layer and of removing exposed hemispherical silicon grain layer comprise choosing a selectivity of an etch process such that the sacrificial layer acts as an etch stop to protect the trench surfaces.

12. The method of claim 11, wherein the sacrificial layer has a thickness to act as an etch stop during the step of removing exposed portions of the hemispherical silicon grain layer, and is electrically conductive.

13. The method of claim 11, wherein the silicate glass layer is doped with arsenic.

14. The method of claim 11, wherein the sacrificial layer comprises silicon nitride.

15. The method of claim 11, wherein the sacrificial layer is formed through thermal nitridation.

16. The method of claim 14, wherein the silicon nitride layer has a thickness of less than about 18 angstroms.

17. The method of claim 16, wherein the silicon nitride layer has a thickness of about 4 to 12 angstroms.

* * * * *